United States Patent [19]

Crowley

[11] 4,374,438
[45] Feb. 15, 1983

[54] DIGITAL FREQUENCY AND PHASE LOCK LOOP

[75] Inventor: Albert T. Crowley, Gloucester Township, Camden County, N.J.

[73] Assignee: RCA Corporation, New York, N.Y.

[21] Appl. No.: 170,999

[22] Filed: Jul. 21, 1980

[51] Int. Cl.³ .................... H04B 1/16; H03L 7/08; G01S 9/56
[52] U.S. Cl. .................. 455/265; 331/1 A; 331/17; 343/6.8 LC; 343/7 PL; 375/120
[58] Field of Search ............ 455/260, 265, 208; 331/1 A, 17, 18, 25; 375/119, 120; 329/122, 123; 324/83 A, 83 D, 83 FE; 328/133, 155; 343/6.8 LC, 7 PL

[56] References Cited

U.S. PATENT DOCUMENTS

| | | | |
|---|---|---|---|
| 3,183,506 | 5/1965 | Webb | 343/17.2 |
| 3,199,104 | 8/1965 | Miller | 343/12 |
| 3,243,811 | 3/1966 | Hose | 343/12 |
| 3,449,691 | 6/1969 | Pasternack et al. | 331/18 |
| 3,521,182 | 7/1970 | Stueck | 331/17 |
| 3,530,470 | 9/1970 | Sheftelman et al. | 343/6.5 R |
| 3,651,422 | 3/1972 | Underhill | 331/1 A |
| 3,730,628 | 5/1973 | Wolcott et al. | 356/5 |
| 3,778,160 | 12/1973 | Wolcott | 356/5 |
| 3,883,817 | 5/1975 | Cliff | 331/1 A |
| 3,959,793 | 5/1976 | Litchford | 343/6.5 R |
| 4,011,562 | 3/1977 | Bruce | 343/6.5 R |
| 4,045,796 | 8/1977 | Kline, Jr. | 343/6.5 R |
| 4,072,947 | 2/1978 | Johnson | 343/14 |
| 4,074,267 | 2/1978 | Knox | 343/106 |
| 4,107,684 | 8/1978 | Watson, Jr. | 343/7.5 |
| 4,135,166 | 1/1979 | Marchetti | 331/17 |
| 4,144,572 | 3/1979 | Starner et al. | 364/487 |

Primary Examiner—Marc E. Bookbinder
Attorney, Agent, or Firm—Samuel Cohen; Joseph S. Tripoli; Donald W. Phillion

[57] ABSTRACT

An improved jitter-free system for phase locking a locally generated signal with a received signal. The system provides and arithmetic synthesizer having a clock signal source which clocks a binary increment contained in an input register into the digital accumulator of the arithmetic synthesizer. A converter converts the output of the accumulator into the locally generated two-level signal whose frequency is determined by the average overflow rate of the accumulator. Logic including a phase detector compares the phases of the received and locally generated signals to produce an error signal whose magnitude is proportional to the phase difference between the received and locally generated signals and also an early/late phase changing periodic two level signal. A voltage-to-frequency (V/F) converter responds to said error signal to produce a first signal whose frequency is proportional to the magnitude of the error signal. An up/down counter means responds to the first signal to count at a rate equal to the frequency thereof and in a direction determined by the level of the periodic two level signal. The input register responds to the count in said up/down counter to vary the binary increment supplied to the accumulator to phase lock the received and locally generated signals.

5 Claims, 5 Drawing Figures

DIGITAL FREQUENCY AND PHASE LOCK LOOP

The United States Government has rights in this invention pursuant to Contract No. u/F33562-78-C-0177, awarded by the Department of the Air Force.

This invention relates generally to signal recognition logic systems for receiving and recognizing signals, and more particularly to such a system employing a digital phase lock loop which causes a locally generated signal to become phase locked with the received signal.

There are many communications systems in which it is necessary to recognize a received tone and to cause a locally generated tone to become phase locked with such received signal. For example, such need for recognizing and phase locking a locally generated signal with a received signal occurs in range finding systems wherein an interrogator first transmits a signal, usually encoded, to a transponder. The transponder must have the capability of identifying the encoded signal received from the interrogator and then generating a similarly encoded signal which is phase locked with the received encoded signal. Such encoded signal generated at the transponder is then transmitted back to the interrogator where it is compared with the originally transmitted signal whose phase has been preserved at the interrogator. The difference in phase between the originally received transmitted signal and the signal received from the transponder represents and round-trip propogation time of a signal transmitted between the interrogator and the transponder. Such propogation time is easily translated into the distance between the interrogator and the transponder.

It is necessary that the transponder be capable of not only generating a signal which is phase locked with the received signal while the interrogation signal is in fact being received but also to remember such phase and frequency relationship at the termination of the received interrogation signal in order to generate and transmit a similarly encoded signal with the same phase and frequency relationship to the received interrogation signal.

In applications other than range finding devices it might only be necessary to phase lock a locally generated signal, derived from a constant phase reference signal, with the received signal.

One prior art means of tracking a received signal and becoming phase locked therewith employs an arithmetic synthesizer. An arithmetic synthesizer is essentially a device comprising a constant frequency clock source which clocks a given binary value repeatedly into an accumulator. Such binary value accumulates in the accumulator until the total exceeds the capacity of the accumulator at which time the accumulator overflows and the process begins anew. The rate at which the accumulator overflows constitutes the output frequency of the arithmetic synthesizer. It is apparent that by changing the binary value added to the accumulator at the clock frequency, the overflow rate of the accumulator and therefore the output frequency thereof can be varied.

Since phase can be varied by changing frequency in very fine increments for a finite period of time, the phase of the output of the accumulator can be caused to become locked to the phase of the received signal if the capacity of the accumulator is large and the increments sufficiently fine.

Specifically, for example, if an arithmetic synthesizer accumulator has a capacity of 18 bit positions, the upper 8 bit positions can be arbitrarily employed to generate a frequency equal to that of a received signal. Small, delta binary values can be added to the lower 10 bit positions to provide very small frequency changes in order to shift the phase of the received signal to that of the received signal.

The delta incremental binary value is generated in an up/down counter control which is activated by an error frequency input with the up or down count being determined by and substantially proportional to the phase difference between the output of the arithmetic synthesizer and the received signal. Such phase comparison occurs in a phase lock loop which includes the arithmetic synthesizer.

Because the clock pulses supplied to the up/down counter are of a high frequency, and further because of the inherent time delay in a phase lock loop, a considerable amount of jitter is introduced into the output signal of the arithmetic synthesizer as a result of phase shift overshoot. Such jitter places limitations on the degree of precision of phase lock that can be obtained with the above discussed prior art.

In a preferred form of the invention there is provided an improved, jitter-free system for phase locking a locally generated signal with a received signal. The system provides an arithmetic synthesizer having a clock signal source which clocks a binary increment contained in an input register into the digital accumulator of the arithmetic synthesizer. Other means convert the output of the accumulator into the locally generated two-level signal whose frequency is determined by the average overflow rate of the accumulator. Logic means responds to the received and locally generated signals to produce an error signal whose magnitude is proportional to the phase difference between said received and locally generated signals and also a periodic two level signal. A voltage-to-frequency (V/F) converter means responds to said error signal to produce a first signal whose frequency is proportional to the magnitude of said error signal. Up/down counter means responds to said first signal to count at a rate equal to the frequency thereof and in a direction determined by the level of said periodic two level signal. The said input register responds to the count in said up/down counter means to vary the binary increment supplied to said accumulator to phase lock said received and locally generated signals.

DETAILED DESCRIPTION OF INVENTION

Figure 1:
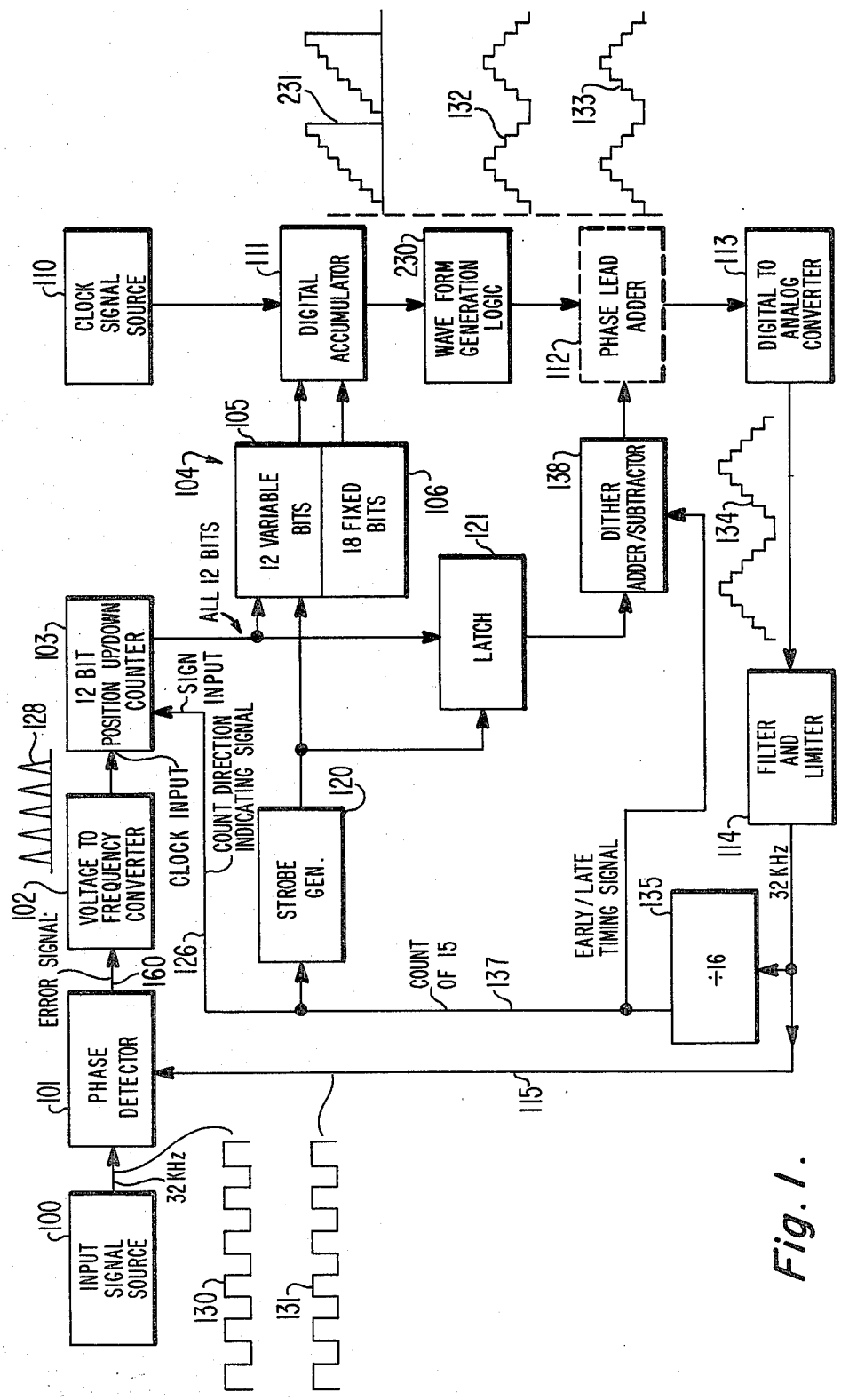
FIG. 1 is a combination block and logic diagram of the basic form of the invention.

Referring now to FIG. 1 an input signal source 100 can be, for example, a transmitter constructed to supply to phase detector 101 a signal which, after proper processing, has a two-level format shown in waveform 130.

Also supplied to phase detector 101 is a second two-level signal 131 which is locally generated in the logic of FIG. 1.

Because of various factors, such as the Doppler effect for example, it is possible that the received signal 130 not only can be out of phase with locally generated signal 131 but also can have a frequency slightly different from locally generated signal 131.

It is the purpose of the logic of FIG. 1 to change the phase of signal 131 and, if necessary, the frequency thereof in order that it will become phase locked with the received signal 130 and then to store the phase of the altered locally generated signal. Such locally generated signal 131 is generated by means of an arithmetic frequency synthesizer which comprises clock signal source 110, digital accumulator 111 and an input register 104 which repeatedly supplies an incremental binary value to accumulator 111 at a rate determined by clock pulse source 110.

Arithmetic frequency synthesizers are well known in the art and will not be described in detail herein. A general description, however, will be set forth. The basic principles of an arithmetic synthesizer is to repeatedly add an incremental binary value stored in an input register, such as register 106, into a digital accumulator 111 which will periodically overflow. The overflow rate of accumulator 111 determines the frequency of the output signal of the arithmetic synthesizer.

The digitized output data words of digitial accumulator 111, in the absence of any logic to provide a different waveform, represent a stepped sawtoothed waveform 231 which rises to peak and then, when digital accumulator 111 overflows, falls immediately to a low value depending upon the amount which the last incremental binary value exceeded the capacity of the accumulator 111. The process is then interatively repeated in that the contents of accumulator 111 repeatedly increases to its overflow capacity and then repeatedly drops to a low value.

By appropriate waveform generation logic 230, shown in detail in co-pending application Ser. No. 170,998 filed concurrently herewith by Albert Crowley and entitled "Phase Comparator System" and and U.S. Pat. No. 4,295,098 to Crowley, entitled "Digitally Adjustable Phase Shifting Circuit", the '098 patent being incorporated herein by reference, the digitized values representing the sawtoothed waveform 231 ordinarily generated by digital accumulator 111 are altered to represent the stepped triangularly waveform 132 of FIG. 1. The digitized values representing waveform 132 are supplied to phase lead adder 112 which, in effect, shifts the phase of waveform 132 to produce a waveform 133 (still represented by digitized values) by an amount substantially equal to the then existing phase difference between waveforms 130 and 131 to anticipate the phase change required in the locally generated signal 131 and thereby avoid hunting or other instabilities in the phase lock loop of the system, to be described later herein.

A digitial-to-analog converter 113 converts the digitized words supplied from phase lead adder 112 into a stepped analog signal, such as signal 134. Subsequently, filter and limiter means 114 processes waveform 134 into the locally generated two-level signal 131 which has the same frequency as waveform 134.

The three logic blocks 102, 103 and 104 operate together to change the frequency and phase of the signal represented by the digital words outputted from digital accumulator 111. More specifically, phase detector 101 responds to the two signals 130 and 131 supplied thereto to produce an error output signal whose magnitude represents the degree of phase difference between signals 130 and 131 and whose polarity indicates the leading or lagging relationship of the phase of signals 130 and 131. The voltage-to-frequency (V/F) converter 102 responds to the error output signal from phase detector 101 to provide to up/down counter 103 a train of pulses 128 via output lead 127 thereof whose repetition rate is proportional to the magnitude of the d.c. voltage supplied thereto. By means to be described later a count direction indicating signal is also supplied to counter 103 via lead 137 from divider 135. Up/down counter 103 responds to the train of pulses 128 to count at a repetition rate of said train of pulses and responds to the count direction indicating signal on lead 137 to count either up or down.

The count contained in counter 103 is supplied to the 12 least significant bit (LSB) positions 105 of a 30 bit input register 104. The upper 18 most significant bit (MSB) positions of input register 104 contain a fixed binary value which is supplied to digital accumulator 111 to cause the output thereof to be the basic tone frequency (32 KHz) of the system. As indicated above, such frequency often must be altered to accommodate a Doppler effect present in the received signal and the phase thereof must also be altered to become synchronized with the phase of said received signal. Such frequency and phase synchronization is accomplished by changing the contents of the 12 least significant bit positions of register 104. Such change is in fact effected by changing the count in up/down counter 103 in the manner described below.

As long as a phase difference exists between the locally generated and received signals 131 and 130, phase detector 101 will supply a finite error signal to voltage-to-frequency converter 102 which in turn will alter the count contained in counter 103. When the phases of the locally generated and received signals become synchronized there will be no output signal from phase detector 101 and consequently no output from the voltage-to-frequency converter 102. The count in counter 103 will then become stable so that the total binary value in register 104 and latch 121 will also become fixed. Thus the output of filter and limiter 114 will represent a signal in digitized word form having a phase which is synchronized with the phase of the received signal 130.

As is well known, phase lock loops have a tendency to hunt or become unstable in the absence of proper corrective measures. The term "hunting" implies that the phase of the locally generated signal will oscillate back and forth into a slight leading and lagging relationship with the phase of the received signal. Basically such hunting is caused by the time required for a corrective change to propogate through the system, in that that the corrective change is still propogating through the system after the phase of the locally generated signal has in fact become synchronized with the phase of the received signal. Thus, excessive corrective change occurs.

To prevent such hunting in the phase lock loop the anticipated phase correction is supplied from the up/down counter 103 to a phase lead adder 112 through latch 121 and dither adder/subtractor 138. The number of bit positions in adder 112 determines the damping factor of the loop. Thus, the output of phase lead adder 112 is a series of binary words similar to those outputted from digital accumulator 111 but whose phase has been shifted by an amount required to provide proper loop damping.

Another means of obtaining improved performance in the phase lock loop is with the aid of early/late timing logic. Essentially, early/late timing functions to alternately retime the locally generated signal so as to advance and retard its phase by equal time intervals. The retimed locally generated signal is then compared in phase with the received signal. Thus if the received signal is closer in phase to the early signal, the output of the phase detector 101 will be larger during the early time period. Conversely, if it is closer to the late phase, the phase detector output will be greater during the late period. If the received signal is equally spaced between the early and late phases the phase detector 101 output will be the same for both the early and late time periods. The output of phase detector 101 is converted to a frequency by voltage-to-frequency (V/F) converter 102 and employed to clock up/down counter 103. The count direction is controlled by the early/late signal appearing on lead 137 from divider 135.

Thus, up/down counter 103 will count in one direction during the early condition of the locally generated signal and will count in the other direction during the late condition of the locally generated signal. If the early and late conditions of the locally signal are not spaced equal angular distances on either side of the phase of the received signal the voltage output from phase detector 101 will be greater for one condition than the other condition. Consequently, the frequency of the V/F converter 102 will be higher in frequency for said one condition than for the other condition.

Accordingly up/down counter 103 will count more during the said one condition of the locally generated signal than it will during the other condition of the locally generated signal. The difference in the two counts is representative of the degree of non-synchronization of the phase of the locally generated and received signals. At the end of each cycle of early/late condition, the contents of the up/down counter 103 are transferred into the 12 variable bit portion 105 of input register 104 so that said input register 104 is periodically updated to reflect the current phase difference of the locally generated and the received signals.

The early/late phase characteristic is introduced into the locally generated signal by the dither adder/subtractor 138 under control of the output of divide-by-16 divider 135. The dither adder/subtractor 138 will alternately add or subtract a constant to the digital word in latch 121. The most significant bit of divider 135 determines if the phase should be advanced or retarded. Divider 135 receives its input from the 32 KHz output of filter and limiter logic 114, which output is the locally generated 32 KHz signal. Thus, the phase of the locally generated signal is alternately advanced and retarded every eight cycles of the locally generated 32 KHz signal.

Figure 2:
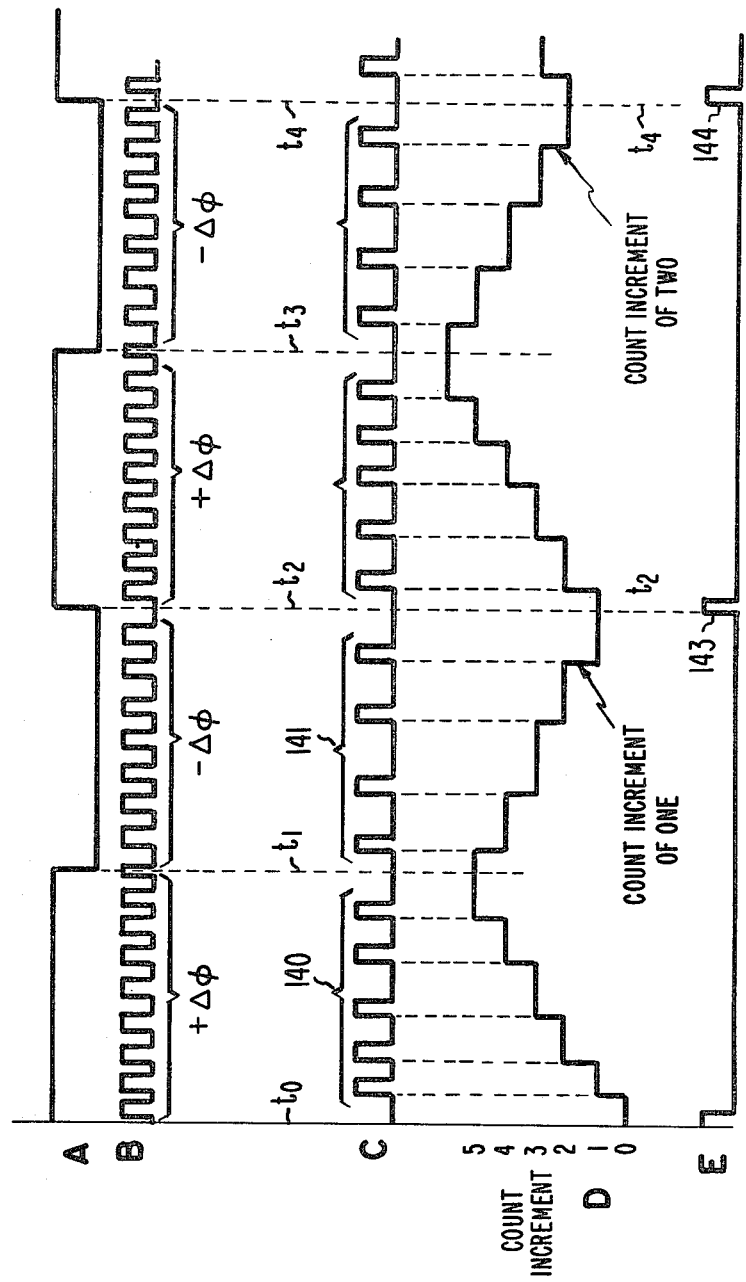
FIG. 2 is a set of waveforms to facilitate an understanding of the block diagram of FIG. 1.

The output of divider 135 is shown in waveform A of FIG. 2 and is derived from the two-level input signal shown in waveform B of FIG. 2 which does in fact exhibit the early/late phase condition because of the effect of dither adder 138.

Figure 4:
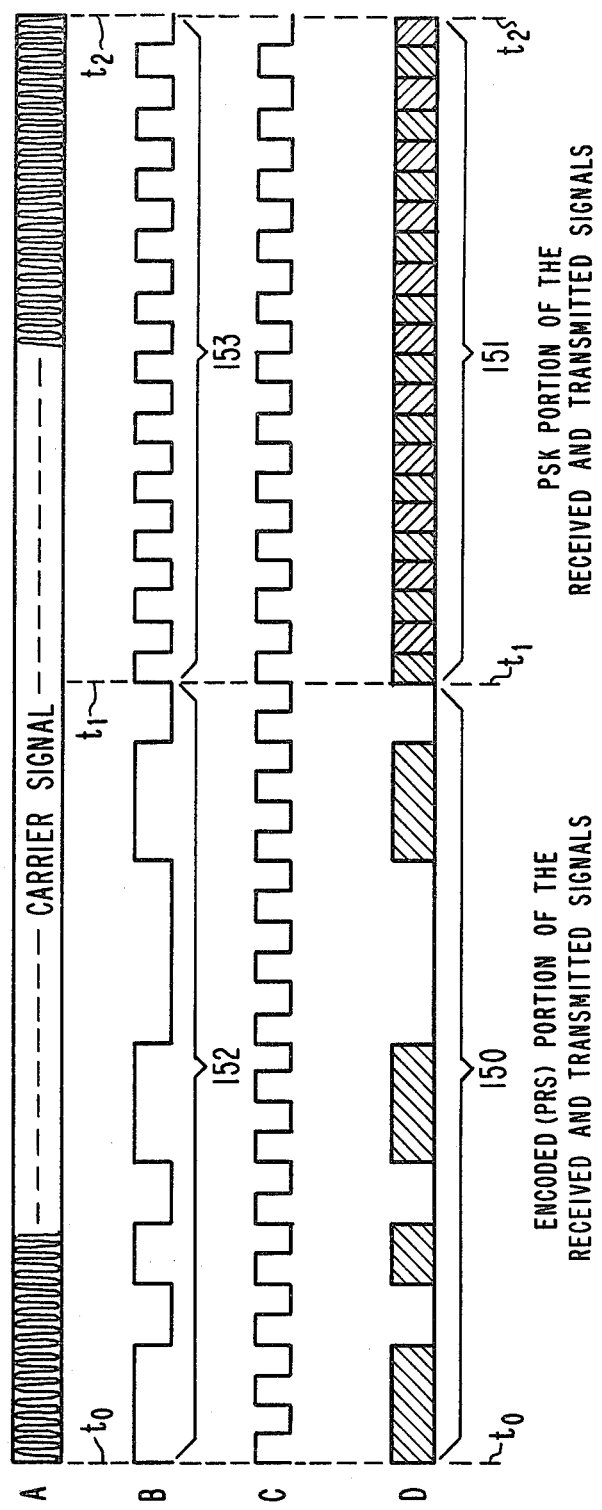
FIG. 4 is a set of waveforms showing the nature of the signals employed in the interrogation and responsive signals.
Figure 5:
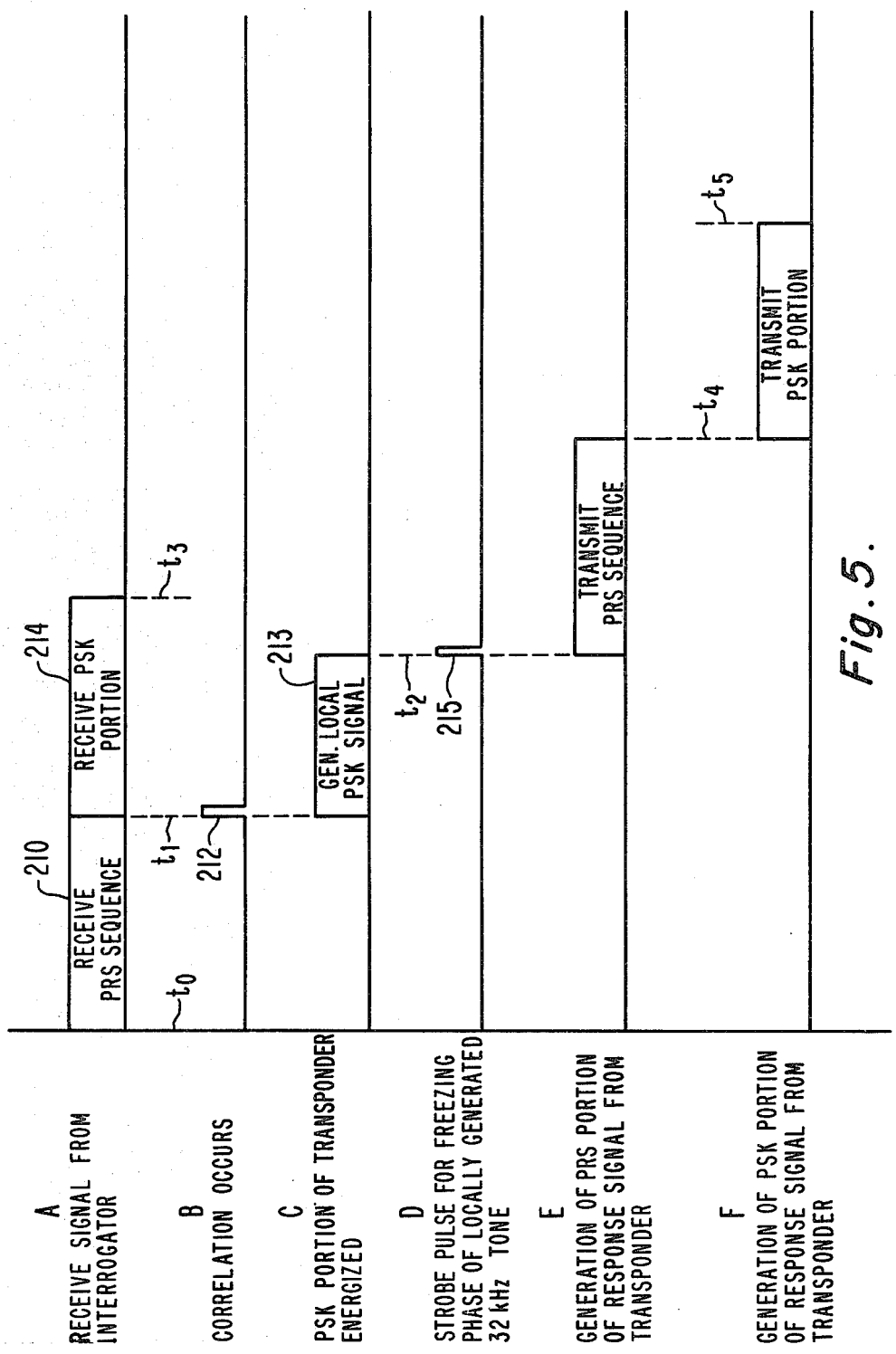
FIG. 5 is a set of bar waveforms showing the timing sequence of the signals employed in the invention.

It is to be noted that the waveforms of FIG. 2 will sometimes be identified herein as waveforms 2A, 2B . . . 2E, rather than waveform A or waveform B of FIG. 2. Similar notation will be employed re the waveforms of FIGS. 4 and 5.

The early phase conditions are shown between times $t_0-t_1$ and $t_2-t_3$ of the waveforms of FIG. 2 whereas the late phase conditions are shown between times $t_1-t_2$ and $t_3-t_4$. Early and late phase shifts are designated by $+\Delta\phi$ and $-\Delta\phi$, respectively, in waveform 2B.

It will be noted that the contents of the most significant bit position of divider 135 (FIG. 1) will change levels every eight counts thereof so that dither adder/subtractor 138 will create the early/late conditions every eight counts of divider 135. On the falling edges each binary count of 111 (15) appearing on output lead 137 of divider 135 the 12-bit position up/down counter 103 is caused to supply its contents to the 12 variable bit portion 105 of input register 104 and latch 121 by means of the strobe pulses of waveform 2E.

The aforementioned functions are shown in waveforms 2C, 2D and 2E. Waveform 2C represents the change in count in up/down counter 103 during each alternate early and late condition. It has been assumed that the early condition will produce a larger error voltage from phase detector 101 than a late condition. Specifically during early phase time periods $t_0-t_1$ and $t_2-t_3$ the counter 103 will be caused to increase its count by 5 as shown in waveform 2D. For example, assume that at time $t_0$ the count of counter 103 is 0. Then, during the time period $t_0-t_1$ the counter 103 will count up to increase its count by 5 due to the 5 pulses 140. Next, during time period $t_1-t_2$, and also during time period $t_3-t_4$, the locally generated signal will be in its late condition and the counter 103 will count down. However, since the difference in phase between the locally generated signal and the received signal is less during the late condition than during the early condition, the counter 103 will count down only 4 counts during time period $t_1-t_2$ as shown by the 4 pulses 141 supplied from V/F converter 102 to counter 103.

Consequently, at time $t_2$, which constitutes a complete cycle of early/late condition, the counter will have increased its count by 5 during time period $t_0-t_1$ and then will have decreased its count by 4 during time period $t_1-t_2$, resulting in a net change of plus one count in counter 103. At the count of 15 of divider 135, represented by strobe pulse 143 at time $t_2$ in waveform 2E, the count in counter 103 is supplied to the 12 variable bit positions 105 of input register 104. Such strobe pulse is generated by strobe generator 120 of FIG. 1.

During the subsequent time period $t_2-t_4$ the counter again increases its count by 5 and then decreases it by 4 so that at time $t_4$ the total incremental change in count of counter 103, measured from time $t_0$, is 2. At time $t_4$ the contents of counter 103 are again supplied to the 12 variable bit positions 105 of input register 104 by means of strobe pulse 144 supplied from divider 135 via lead 137 and strobe generator 120 at the count of 15 of said divider 135.

As stated above the error voltage output from phase detector 101 will vary in magnitude depending upon whether the early or late phase condition of the locally generated signal is in effect since said early/late timing signal is supplied to dither adder 138. Also, as stated above, the early/late signal from divider 135 is supplied directly to 12-bit up/down counter 103 via lead 137 with the polarity thereof (a binary 1 or 0) determining the direction of count of counter 103. Consequently, the output of V/F converter 102 is synchronized with the early/late timing signal supplied to up/down counter 103. Accordingly, during the early portion of the early/late timing signal the up/down counter 103 will count upwards in accordance with the frequency of the output signal of V/F converter 102 and during the late portion of the early/late timing signal the up/down counter 103 will count downwardly in accordance with the frequency of the output signal of V/F converter 102.

As stated above, at the end of each cycle of counting up and then counting down, during the early and late portions of the early/late timing signals, the register 106 is strobed at the count of 15 of divider 135 by strobe means 120 to cause the contents of counter 103 to be supplied to the 12 variable bit positions 105 of input register 104 of the arithmetic synthesizer.

Figure 3:
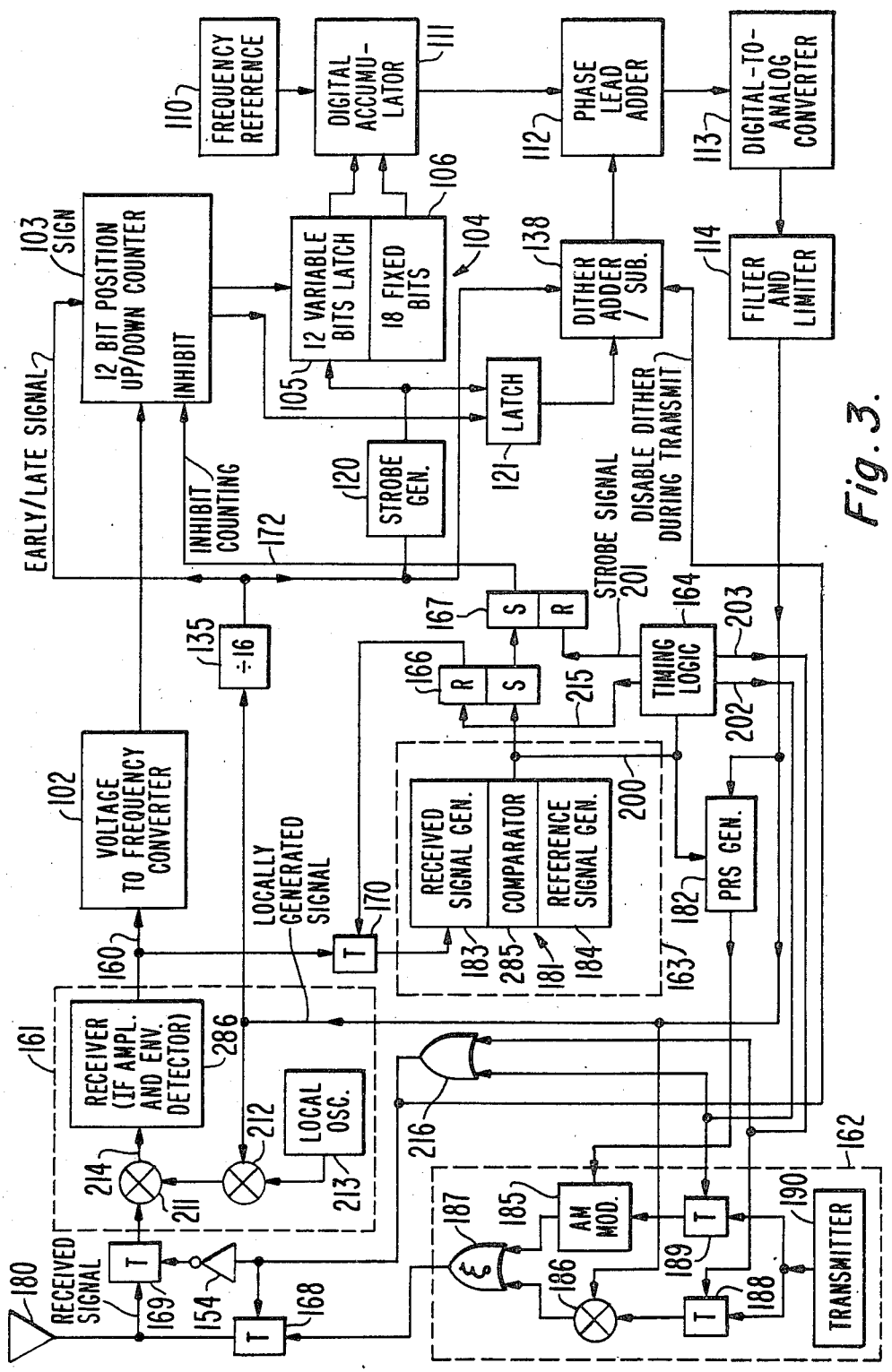
FIG. 3 is a block diagram of a form of the invention adapted to a transponder in a range determining system.

Referring now to FIG. 3 there is shown an adaptation of the structures of FIG. 1 to a transponder in a range finding system. The transponder of FIG. 3 can function in cooperation with the interrogator shown and described in the aforementioned co-pending application Ser. No. 170,998, filed concurrently herewith by Albert Crowley and entitled, "Phase Comparator System".

Many of the elements of FIG. 3 correspond to elements of FIG. 1 and are identified by the same reference characters. The new structure added to FIG. 3 is contained largely within dotted blocks 161 and 162, the PRS generator 182, correlator 181, timing logic 164, flip-flops 166 and 167, and transmission gates 168, 169, and 170, all of which function under the control of timing logic 164.

Generally speaking, the logic within dotted block 161 is employed to demodulate and decode a signal received from an interrogator via antenna 180 to produce on the output lead 160 of block 161 a signal which corresponds to the signal supplied to output lead 160 of FIG. 1. Because the system of FIG. 3 is a transponder, the received signal consists of an encoded portion and a PSK portion with the encoded portion containing, for example, a carrier signal amplitude modulated by a pseudo random sequence (PRS) as shown in portion 150 of waveform 4D and the remainder of the signal being a carrier signal modulated by the basic 32 KHz tone as shown in portion 151 of waveform 4D.

Correlator 181, which consists of a received signal register 183, a reference signal generator 184, and a comparator means, 285 functions to receive the output of the receiver 186 within the dotted block 161 through TRANSMISSION gate 170 to output a signal from comparator 285 when the encoded portion 150 of the received signal of waveform 4D correlates with a similarly encoded signal stored (staticized) in the reference signal register 184.

The correlation pulse from comparator 185 sets flip-flops 166 and 167 to disable TRANSMISSION gate 170 and to initiate PRS generator 182. Disabling of TRANSMISSION gate 170 blocks the remaining PSK portion of the received signal from being supplied to correlator 181. However, the remaining PSK signal portion is supplied to V/F converter 102. It is to be understood that the PSK portion of the signal is demodulated in receiver 286, resulting in the 32 KHz tone shown in portion 153 of waveform 4B.

The setting of flip-flop 167 removes the inhibit signal from up/down counter 103 allowing it to count to track the received signal. Dither adder/subtractor 138 is also enabled during this time when the transponder is in the receive mode.

After receiving the interrogation signal and becoming phase locked therewith the system of FIG. 3 becomes switched, by means of timing logic to be described later herein, to generate in PRS generator 182 an encoded PRS signal of the configuration shown between times $t_0$ and $t_1$ of waveform 4B. Such signal is supplied to AM modulator 185 of the logic within dotted block 162 which responds thereto to generate the carrier modulated signal as shown in portion 150 of waveform 4D for transmission back to the interrogator.

After generation of such PRS portion of the signal to be transmitted back to the interrogator, the PSK portion of the responsive signal is generated by means of mixer 186 which functions to phase shift modulate the carrier signal from transmitter 190 by the locally generated 32 KHz tone from filter and limiter 114 and then to supply such phase shift modulated carrier signal through summing type OR gate 187 and TRANSMISSION gate 168 to antenna 180.

Consider now in more detail the timing employed in the logic of FIG. 3 and the means for effecting such timing. At the beginning of operation of the system, at time $t_0$ of FIG. 5, the flip-flops 166 and 167 of FIG. 3 are in their reset condition as a result of a start pulse supplied to lead 200 from timing logic 164 and a previously occurring strobe pulse supplied to output lead 201, also from timing logic 164. The reset condition of flip-flop 166 enables TRANSMISSION gate 170 to permit the PRS signal portion 210 of waveform 5A to be supplied to the received signal register 183 of correlator 181. The reset condition of flip-flop 167 generates an inhibit signal via lead 172 which prevents up/down counter 103 from counting. This effectively isolates V/F converter 102 from up/down counter 103, thereby preventing any changes in the digital accumulator 111 so that the arithmetic synthesizer will generate a fixed frequency signal. Such signal will be approximately 32 KHz signal as discussed hereinbefore.

Also at time $t_0$ (FIG. 5) the timing logic 164 (FIG. 3) supplies low level signals to its output leads 202 and 203 to disable TRANSMISSION gate 188 and 189 in the transmit portion 162 of the system and to enable TRANSMISSION gate 169 through INVERTER 154 so that the received signal can pass through TRANSMISSION gate 169 and into the receiver logic 161 wherein the output of a local oscillator 213 is mixed with the locally generated 32 KHz level signal from filter and limiter logic 114. Such mixed signal, is then supplied to a second mixer 211 where it is mixed with the received signal to produce an output signal on lead 214 which is an IF carrier signal amplitude modulated by the PRS signal, the 32 KHz component of the received signal having been removed in the mixing process.

An IF amplifier and envelope detector in receiver 186 next processes the mixed signal to produce the PRS encoded portion of the receiver signal as shown in portion 152 of waveform 4B on output terminal 160. Such PRS signal is supplied through enabled TRANSMISSION gate 170 to the received signal register 183 and, at time $t_1$ of waveform 5A, is fully entered therein. Thus at time $t_1$ the comparator circuit 285 will produce a correlation signal since the received encoded signal in the signal register 183 now correlates with the staticized reference signal stored in reference signal register 184.

At time $t_1$ of waveform 5A, the circuit of FIG. 3 receives the PSK portion of the received interrogation signal and also generates, in response to the correlation pulse 212 of waveform 5B, a PSK signal, as shown in waveform 5C. By means of that portion of the logic of FIG. 3 which corresponds to the logic of FIG. 1, the locally generated PSK portion 213 of waveform 5C is phased synchronized with the received PSK portion 214 of waveform 5A. At time $t_2$ of FIG. 5 the timing logic 164 of FIG. 3 generates a strobe pulse 215 as shown in waveform 5D which resets flip-flop 167 of FIG. 3, thereby inhibiting up/down counter 103 from responding to the output of V/F counter 102 to freeze the frequency and phase of the signal generated at the output of digital accumulator 111 and latch 121 and therefore the output of filter and limiter 114.

Later at time $t_3$ in waveform 5A the received PSK portion 214 terminates. However, the PRS generator was initialized earlier by a pulse from comparator 285 thereby aligning its output with the received PRS signal. More specifically, at time $t_2$ in FIG. 5, a high level output on output 202 of timing logic 164 enables TRANSMISSION gate 189 to pass the carrier frequency generated by local transmitter 190 therethrough and to AM modulator 185. Also supplied to AM modulator 185 is the output of the PRS generator 182 which at all times in the operation of the system is generating a PRS sequence. Such PRS signal is then employed to amplitude modulate the carrier frequency output of transmitter 190. Such AM modulated carrier signal is then supplied through OR gate 187 and enabled TRANSMISSION gate 168 to antenna 180. TRANSMISSION gate 168 is enabled by the high level signal supplied through OR gate 216 from output 202 of timing logic 164.

At time $t_4$ of waveform 5E the generation and transmission of the PRS portion of the responsive signal has been completed and the timing logic 164 then generates a low level signal on output lead 202 and a high level signal on output 203, thus disabling TRANSMISSION gate 189 and enabling TRANSMISSION gate 188, thereby supplying the carrier frequency signal from transmitter 190 to mixer 186. Also supplied to mixer 186 is the 32 KHz two level tone from filter and limiter 114. Thus, the output of mixer 186 is a carrier signal phase modulated by the 32 KHz two level signal (the PSK signal of waveform 5F) which is supplied through OR gate 187 and enabled TRANSMISSION gate 168 to antenna 180.

At time $t_5$ the high level signal on output lead 203 of timing logic 164 is terminated to terminate generation of the PSK portion of the responsive signal, as indicated in waveform 5F.

I claim:

1. In a communication system including phase locked loop means for phase locking a locally generated signal with a cyclical portion of a received signal and comprising:

signal value producing means comprising an accumulator, an input register containing a variable value and means including a clock signal source for enabling supply of said variable value to said accumulator at the frequency of said clock signal, with said accumulator being responsive to said variable value being supplied thereto to produce a series of output values representative of a frequency of said locally generated signal;

signal processing means responsive to said series of output values to produce said locally generated signal;

logic means responsive to said locally generated signal and said cyclical portion of said receiver signal to produce an error voltage indicative of the phase difference therebetween and to produce a periodic two level signal;

voltage to frequency converting means for converting said error voltage into a count control signal whose frequency is proportional to said error voltage;

up/down counter means responsive to said count control signal and to said two level periodic signal to count at a rate equal to the frequency of said control signal and in a direction determined by said two level periodic signal to provide a variable output count value; and means responsive to said periodic two level signal for altering the variable value contained in said input register to correspond to said variable output, count value of said up/down counter means.

2. A communication system as in claim 1 in which said received signal further comprises an encoded portion preceding said cyclical portion, and further comprising:

correlating means responsive to said encoded portion of received signal to produce a correlation signal;

said phase locked loop means being responsive to said correlation signal to become energized to lock the phase of said locally generated signal with the cyclical portion of said received signal; and means responsive to the phase locked condition of said received cyclical signal portion and said locally generated signal to generate and transmit a signal having an encoded portion and a second cyclical portion whose phases are identical, respectively, with the phases of the encoded and cyclical portions of the received signal.

3. A communication system as in claim 1 in which said logic means further comprises:

means responsive to said periodic signal to alternately retard and advance the phase of said locally generated signal during phase lacking thereof with said cyclical portion of said received signal.

4. A communication system as in claim 1 and further comprising a phase error lead means responsive to the output of said accumulator and the count in said up/down counter means to alter the phase of the signal-representing output values supplied from said accumulator by an amount determined by the then currently indicated phase difference between the locally generated signal and said cyclical portion.

5. A communication system as in claim 4 in which said phase error lead means is responsive to said periodic two level signal to produce alternate retarding and advancing of the phase of said locally generated signal.

* * * * *

UNITED STATES PATENT AND TRADEMARK OFFICE
CERTIFICATE OF CORRECTION

PATENT NO. : 4,374,438

DATED : 2-15-83

INVENTOR(S) : Albert Timothy Crowley

It is certified that error appears in the above-identified patent and that said Letters Patent is hereby corrected as shown below:

```
In the Abstract, line 16, "said" should be --the--.
    "        "     "   , line 19, delete "means".
    "        "     "   , line 22, "said" should be --the--.
Col. 1, line 26, "and" should be --the--.
Col. 3, line 36, "interatively" should be --iteratively--.
Col. 4, line 6, "phase" should be --phases--.
Col. 10, line 7, "receiver" should be --received-
Col. 10, line 45, "lacking" should be --locking--.
```

Signed and Sealed this

Sixth Day of September 1983

[SEAL]

*Attest:*

*Attesting Officer*

GERALD J. MOSSINGHOFF

*Commissioner of Patents and Trademarks*